United States Patent
Spinali

(10) Patent No.: US 6,577,457 B1
(45) Date of Patent: Jun. 10, 2003

(54) CATADIOPTRIC LENS BARREL STRUCTURE HAVING A KINEMATIC ALIGNMENT STRUCTURE AND METHOD FOR ALIGNING TWO PLANAR SURFACES

(75) Inventor: Marc Spinali, Danville, CA (US)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/636,067

(22) Filed: Aug. 10, 2000

(51) Int. Cl.⁷ .................................................. G02B 7/02
(52) U.S. Cl. ........................ 359/811; 359/819; 359/820
(58) Field of Search ................................. 359/819, 820, 359/811; 372/107

(56) References Cited

U.S. PATENT DOCUMENTS

| | | | |
|---|---|---|---|
| 3,886,474 A | 5/1975 | Hensolt et al. ............... 331/94 |
| 3,953,113 A | 4/1976 | Shull .......................... 359/874 |
| 4,342,117 A | 7/1982 | Singleton .................... 372/107 |
| 4,681,408 A | 7/1987 | Ahmad et al. .............. 359/848 |
| 4,726,671 A | 2/1988 | Ahmad et al. .............. 359/848 |
| 4,733,945 A | 3/1988 | Bacich ........................ 359/820 |
| 4,777,639 A | 10/1988 | Whitehouse ................ 372/107 |
| 4,856,020 A | 8/1989 | Ortiz ........................... 372/107 |
| 4,925,286 A | 5/1990 | Cutburth ..................... 359/874 |
| 4,929,054 A | 5/1990 | Ahmad et al. .............. 359/820 |
| 4,929,073 A | 5/1990 | La Plante et al. ........... 359/848 |
| 5,249,082 A | 9/1993 | Newman ..................... 359/813 |
| 5,268,923 A | 12/1993 | Welsch et al. ............... 372/107 |
| 5,357,300 A | * 10/1994 | Yanagi et al. ................ 396/529 |
| 5,424,873 A | * 6/1995 | Uziie et al. .................. 359/813 |
| 5,428,482 A | 6/1995 | Bruning et al. ............. 359/827 |
| 5,428,483 A | 6/1995 | Sato et al. ................... 359/838 |
| 5,488,514 A | 1/1996 | Bruning et al. ............. 359/811 |
| 5,973,863 A | 10/1999 | Hatasawa et al. ........... 359/823 |
| 5,986,827 A | 11/1999 | Hale ........................... 359/822 |
| 6,122,114 A | 9/2000 | Sudo et al. .................. 359/819 |
| 6,239,924 B1 | 5/2001 | Watson et al. .............. 359/819 |

* cited by examiner

Primary Examiner—Ricky Mack
(74) Attorney, Agent, or Firm—Finnegan, Henderson, Farabow, Garrett & Dunner, L.L.P.

(57) ABSTRACT

A kinematic alignment structure is provided for use as an attachment to a lens barrel. This kinematic alignment structure is well suited for controlling perpendicular orientation of a pair of mirrors carried in a lens barrel that is transversely connecting two parallel lens barrels. The transverse lens barrel carries the mirrors on each end of the transverse lens barrel. The mirrors have a substantially perpendicular orientation from each other. The alignment structure microscopically adjusts the perpendicular alignment of the couple of mirrors. The alignment structure comprises a set of three positioning knobs distributed on each end face of the lens barrel. The mirrors are positioned in direct contact with the lens barrel via the set of three positioning knobs. The positioning knobs comprise a platform, and have raised tubular bodies and spherical top surfaces. The spherical top surfaces may be polished to microscopically adjust the perpendicular orientation between the two mirrors.

16 Claims, 6 Drawing Sheets

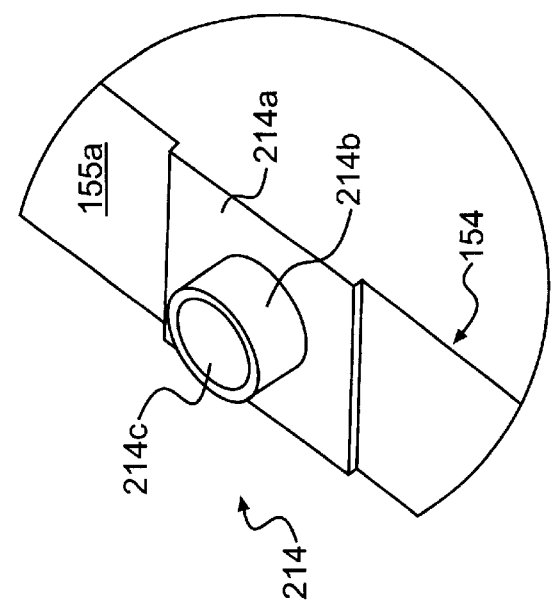
FIG. 5
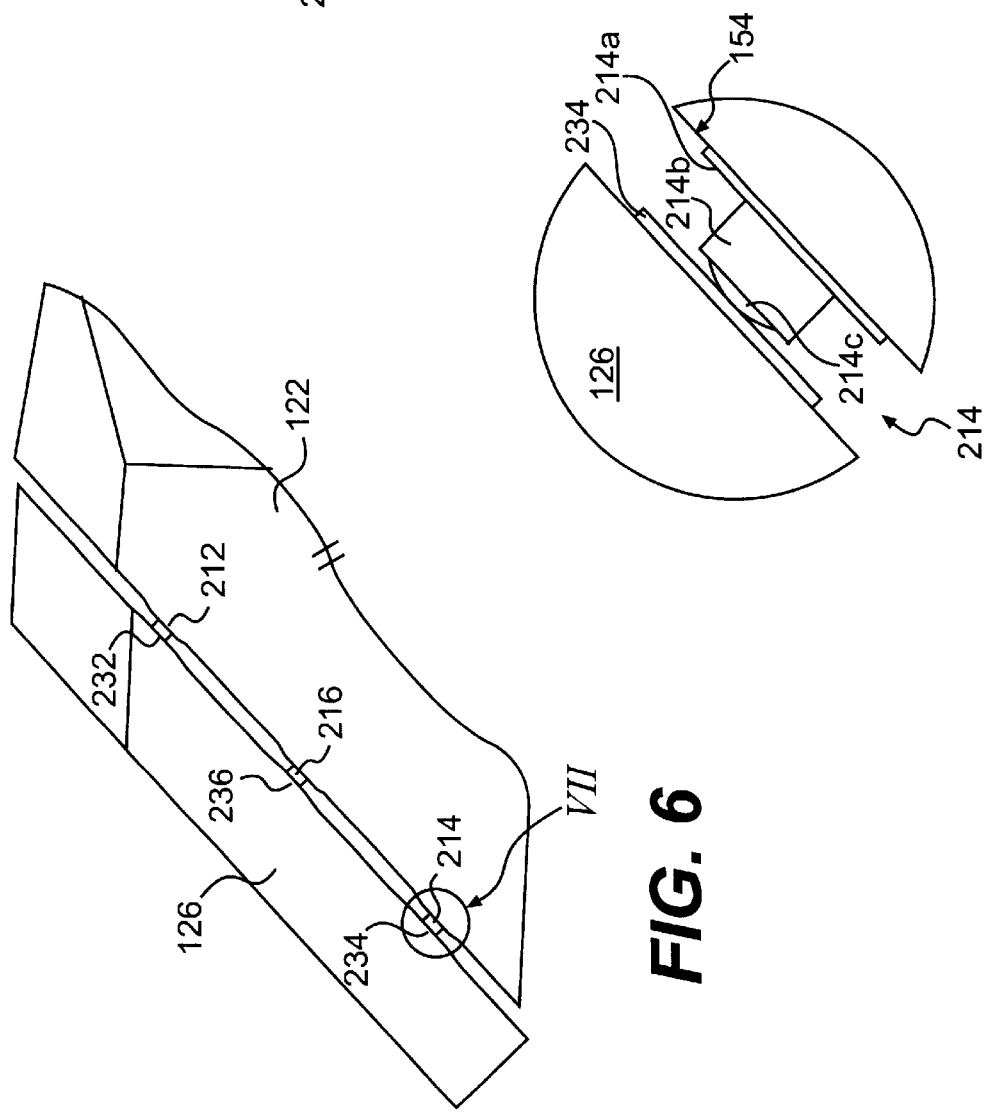
FIG. 7
FIG. 6

CATADIOPTRIC LENS BARREL STRUCTURE HAVING A KINEMATIC ALIGNMENT STRUCTURE AND METHOD FOR ALIGNING TWO PLANAR SURFACES

BACKGROUND OF THE INVENTION

Field of the Invention

This invention relates to a catadioptric lens barrel structure including an alignment structure and a method for aligning two planar surfaces. More particularly, the present invention relates to a kinematic alignment structure using positioning knobs.

DESCRIPTION OF THE RELATED ART

A lens barrel is a tubular mechanical structure containing a series of lenses which are aligned to transfer an image from one end face of the lens barrel to the other. Light enters one end face of the lens barrel and exits through the other. A conventional catadioptric lens barrel, as schematically shown in FIG. 1, is another type of lens barrel. The catadioptric lens barrel structure may comprise a pair of parallel lens barrels B1 and B2, and a connecting lens barrel B3 between lens barrels B1 and B2. First lens barrel B1 has an optical axis 104 running across its length. Likewise, second lens barrel B2 has an optical axis 114 running across its length. Connecting lens barrel B3 may be positioned transversely to lens barrels B1 and B2 to form either a U-configuration or, as illustrated in FIG. 1, an inverted U-configuration. In either configuration, connecting lens barrel B3 normally carries a pair of mirrors 124 and 126 to reflect the light from the first lens barrel B1 to enter the second lens barrel B2. First mirror 124 has a center point C1, while second mirror 126 has a center point C2. First and second center points C1 and C2 are located along first and second optical axes 104 and 114. Optical axis 164 connecting between first and second center points C1 and C2, respectively, is substantially perpendicular to both optical axes 104 and 114.

An optical system, such as the one illustrated in FIG. 1, may be used, for example, in a projection exposure apparatus for production of semiconductor wafers. The projection exposure apparatus includes a template positioned near an entrance end of first lens barrel B1 and a semiconductor wafer positioned near an exit end of second lens barrel B2. The projection exposure apparatus shines light through the template, photographically reduces a pattern on the template, and sequentially transfers the pattern, through first lens barrel B1, connecting lens barrel B3, and second lens barrel B2, and onto a predetermined area on the semiconductor wafer.

In semiconductor wafer production, the focus depth of the optical system is proportional to the miniaturization of a circuit pattern. In addition, mirrors 124 and 126 in connecting lens barrel B3 oftentimes do not align properly. For instance, mirrors 124 and 126 may not accurately align perpendicular to each other. Moreover, the lens barrel structure may need to be repeatedly disassembled to replace the parts or for maintenance reasons, thus altering alignment. Therefore, a primary consideration for this type of optical barrel structure includes designing components which are capable of holding high tolerances and accurate alignment. The components also need to be stable and the aligning process repeatable.

In light of the foregoing, there is a need for a kinematic alignment structure for positioning and aligning mirrors 124 and 126 in the connecting lens barrel B3, as well as an aligning method thereof.

SUMMARY OF THE INVENTION

The advantages and purposes of the invention will be set forth in part in the description which follows, and in part will be obvious from the description, or may be learned by practice of the invention. The advantages and purposes of the invention will be realized and attained by the elements and combinations particularly pointed out in the appended claims.

To attain the advantages and in accordance with the purposes of the invention, as embodied and broadly described herein, the invention is directed to a kinematic alignment structure. The alignment structure positions and aligns a mirror in a lens barrel. The alignment structure comprises a set of at least three positioning knobs. The positioning knobs are distributed at predetermined locations around a perimeter of an end face of the lens barrel. The mirror is positioned in direct contact with the lens barrel via the positioning knobs. The alignment structure may also comprise a cell for supporting the mirror. The cell is positioned in direct contact with the lens barrel via the positioning knobs.

A second aspect of the invention is directed to a lens barrel structure comprising a plurality of lens barrels aligned in a parallel orientation, at least one transverse lens barrel connecting two consecutive lens barrels in the parallel orientation, a support structure to support the plurality of lens barrels and the at least one transverse lens barrel, and a kinematic alignment structure for positioning a first surface and a second surface in the transverse lens barrel.

A third aspect of the invention is directed to a method for kinematically positioning and aligning a first mirror on a first end face of a lens barrel with respect to a second mirror on a second end face of the lens barrel. The method comprises the steps of providing a first set of at least three positioning knobs distributed on the first end face of the lens barrel around a perimeter thereof, and providing a second set of at least three positioning knobs distributed on the second end face of the lens barrel around a perimeter thereof. The method also involve the steps of positioning the first mirror onto the first end face of the lens barrel, and positioning the second mirror onto the second end face of the lens barrel. Then, the method involves the steps of measuring the distance and the angle between the first and the second mirrors, and polishing certain portions of the first set of positioning knobs to adjust the distance and angle of the first mirror with respect to the second mirror. The steps of positioning, measuring, and polishing may be repeated until the distance and the angle of the mirrors are within a targeted tolerance. The method may also comprise a step of providing a first cell for supporting the first mirror and providing a second cell for holding the second mirror. The first cell is positioned in direct contact with the first end face of the lens barrel via the first set of positioning knobs, and the second cell is positioned in direct contact with the second end face of the lens barrel via the second set of positioning knobs.

It is to be understood that both the foregoing general description and the following detailed description are exemplary and explanatory only and are not restrictive of the invention as claimed.

Additional advantages will be set forth in the description which follows, and in part will be understood from the description, or may be learned by practice of the invention. The objects and advantages may be obtained by means of the combinations set forth in the attached claims.

BRIEF DESCRIPTION OF THE DRAWINGS

The accompanying drawings, which are incorporated in and constitute a part of this specification, illustrate several embodiments of the invention and, together with the description, serve to explain the principles of the invention. In the drawings.

FIG. 5 is an enlarged perspective view of one of the three positioning knobs taken from detail V of FIG. 4;

FIG. 6 is a partial front view of the connecting lens barrel and the second mirror consistent with the principles of the present invention;

FIG. 7 is an enlarged front view illustrating one of the three positioning knobs on the connecting lens barrel matching one of the three reference pads on the second mirror taken from portion VII of FIG. 6.

DESCRIPTION OF THE PREFERRED EMBODIMENT

Reference will now be made in detail to the present embodiment of the invention. The accompanying drawings illustrate some examples of such embodiment. Wherever possible, the same reference numbers will be used throughout the drawings to refer to the same or like parts. The invention will be further clarified by the following examples, which are intended to be exemplary of the invention.

Apparatus and methods consistent with this invention are generally directed to aligning two planar surfaces. More particularly, the invention is well-suited for controlling perpendicular orientation of the pair of mirrors carried inside a connecting lens barrel which is transversely positioned between two parallel lens barrels, such as in a catadioptric lens barrel structure shown in FIG. 2. A kinematic alignment structure according to this invention comprises a set of three positioning knobs positioned on each of the two end faces of the transverse lens barrel to kinematically control perpendicular orientation of the mirrors. Each mirror is positioned in direct contact with the transverse lens barrel via a set of positioning knobs. The mirrors may be adjusted by spot polishing certain portions of the positioning knobs until the distance and the angle of the mirrors are within a set of targeted tolerances. The kinematic alignment structure may also comprise a pair of lens cells attached for supporting the pair of mirrors. The lens cells are positioned in direct contact with the lens barrel via the two sets of positioning knobs. Examples of apparatus and methods consistent with this invention will be shown with respect to a catadioptric lens barrel structure, but this invention is not limited to such a structure.

According to one example, a catadioptric lens barrel structure is provided with a plurality of lens barrels. Each lens barrel has an optical axis running along the length of its corresponding lens barrel, the optical axes being in parallel and defining a frontal plane.

Figure 2:
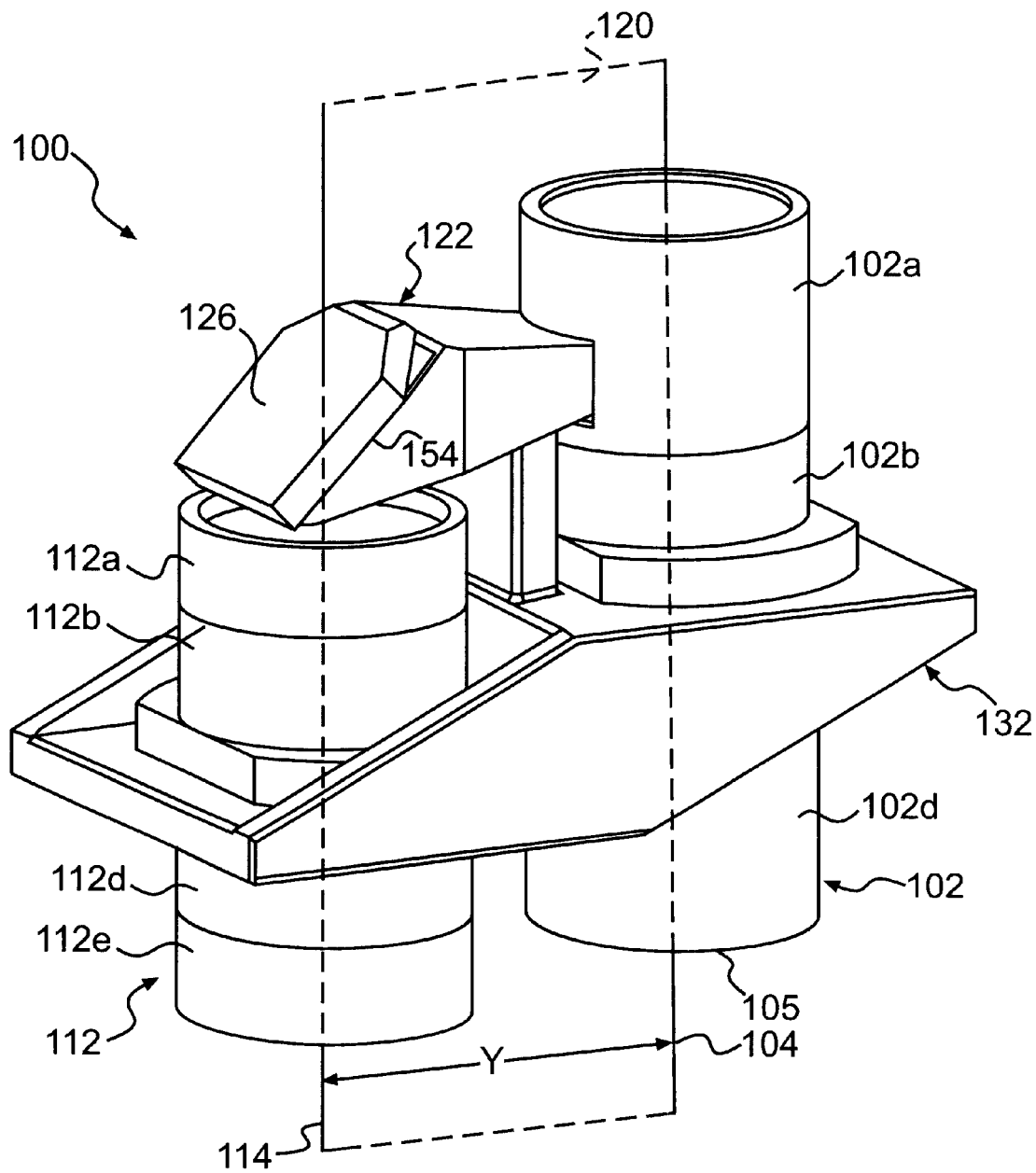
FIG. 2 is a perspective view of a catadioptric lens barrel structure.

FIG. 2 illustrates one embodiment of a catadioptric lens barrel structure 100. barrel structure 100 comprises a pair of lens barrels including a first lens barrel 102 and a second lens barrel 112. First lens barrel 102 has a first optical axis 104 along its length. Similarly, second lens barrel 112 has a second optical axis 114 running along its length. First and second optical axes 104, 114 run parallel to each other and define a frontal plane 120. First and second lens barrels 102, 112 can be made of a rigid material, such as silicon carbide or stainless steel, for example SS17-7PH, SS440 series, or SS300 series.

Consistent with the principles of the invention, the catadioptric lens barrel structure includes at least one transverse lens barrel. The number of transverse lens barrels equals to the number of lens barrels minus one. The transverse lens barrels connect one of the plurality of lens barrels to the next successive lens barrel. Each transverse lens barrel includes at least a pair of reflective elements. The reflective elements are angularly oriented to reflect an image from one lens barrel to the next successive one. In a semiconductor environment, the image is from a reticle and the image is passed through successive lens barrels until it finally reaches a semiconductor wafer in front of an exit end of the last lens barrel.

As shown in FIG. 2, catadioptric lens barrel structure 100 includes a transverse lens barrel 122 connecting first lens barrel 102 to second lens barrel 112. Transverse lens barrel 122 carries therein a first mirror 124 (best shown in FIGS. 1 and 3) and a second mirror 126. First mirror 124 is hidden by first lens barrel 102. Mirrors 124 and 126 have a substantially perpendicular orientation. Transverse lens barrel 122 is preferably made of a material having a low coefficient of thermal expansion. For example, the coefficient of thermal expansion may be as low as 6 ppm/° C. or below.

Table 1 shows some examples of materials having this property.

TABLE 1

| Materials | Coefficients of Thermal Expansion |
| --- | --- |
| Alumina Ceramic ($Al_2O_3$) | 5.7 ppm/° C. |
| Invar | 0.64–3.11 ppm/° C. (depending on heat treatment) |
| ULE ™ | 0.03 ppm/° C. |
| Zerodur | 0.05 ppm/° C. |
| Silicon Carbide (SiC) | 0.4–5.1 ppm/° C. (depending on temperature range) |

Also consistent with the principles of the invention, the catadioptric lens barrel structure is provided with a support structure. The support structure is made of a material having a low coefficient of thermal expansion. The support structure supports the lens barrels, including the transverse lens barrel.

In the embodiment illustrated in FIG. 2, support structure 132 supports the first and second lens barrels 102, 112 as well as the transverse lens barrel 122. Support structure 132 is preferably made of a material having a low coefficient of thermal expansion. For example, the coefficient of thermal expansion may be as low as 6 ppm/° C. or below. Table 1 above shows examples of materials having this property.

Figure 1:
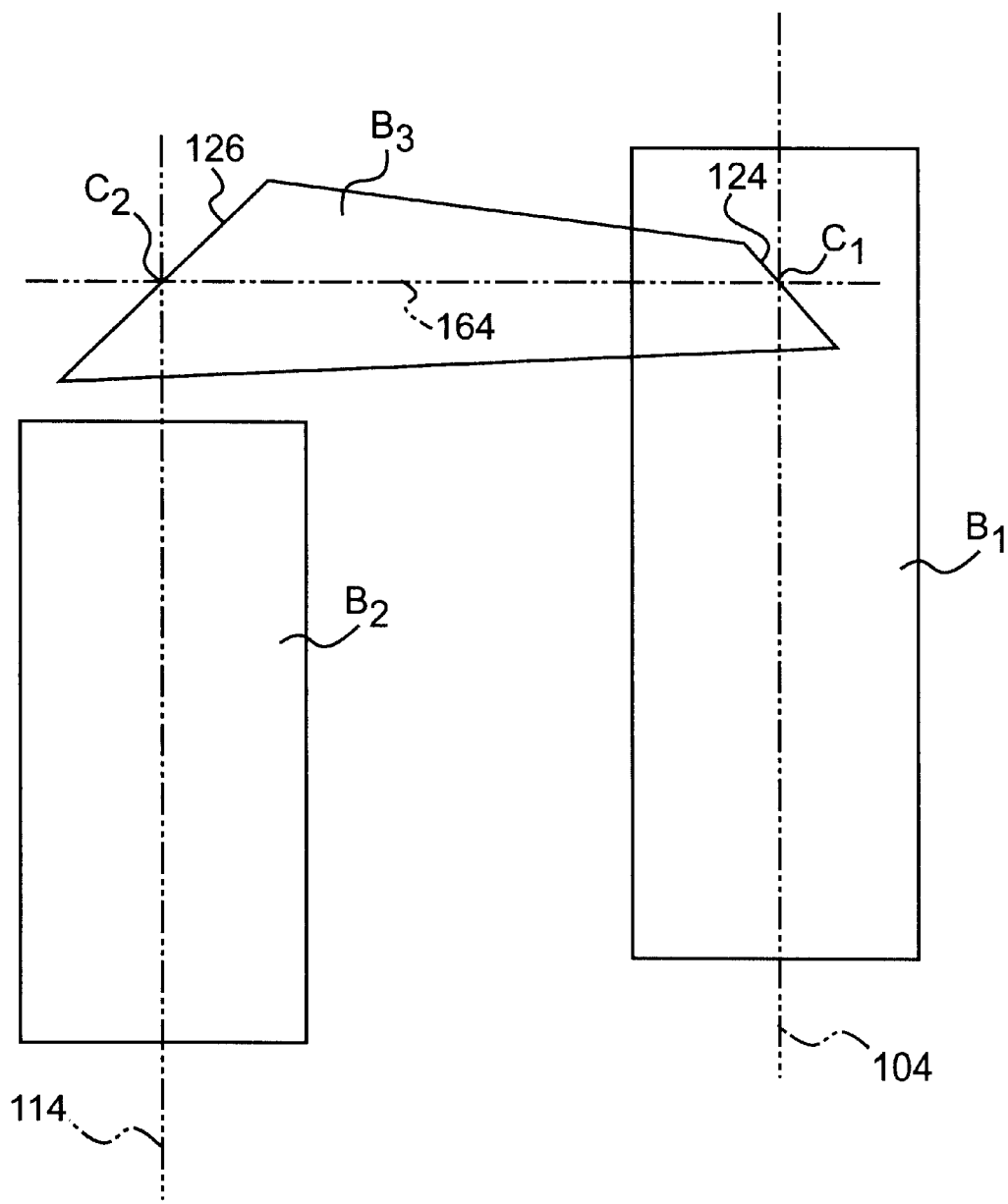
FIG. 1 is a schematic view of a catadioptric lens barrel structure illustrating an inverted U-configuration of a first lens barrel, a connecting lens barrel, and a second lens barrel.
Figure 3:
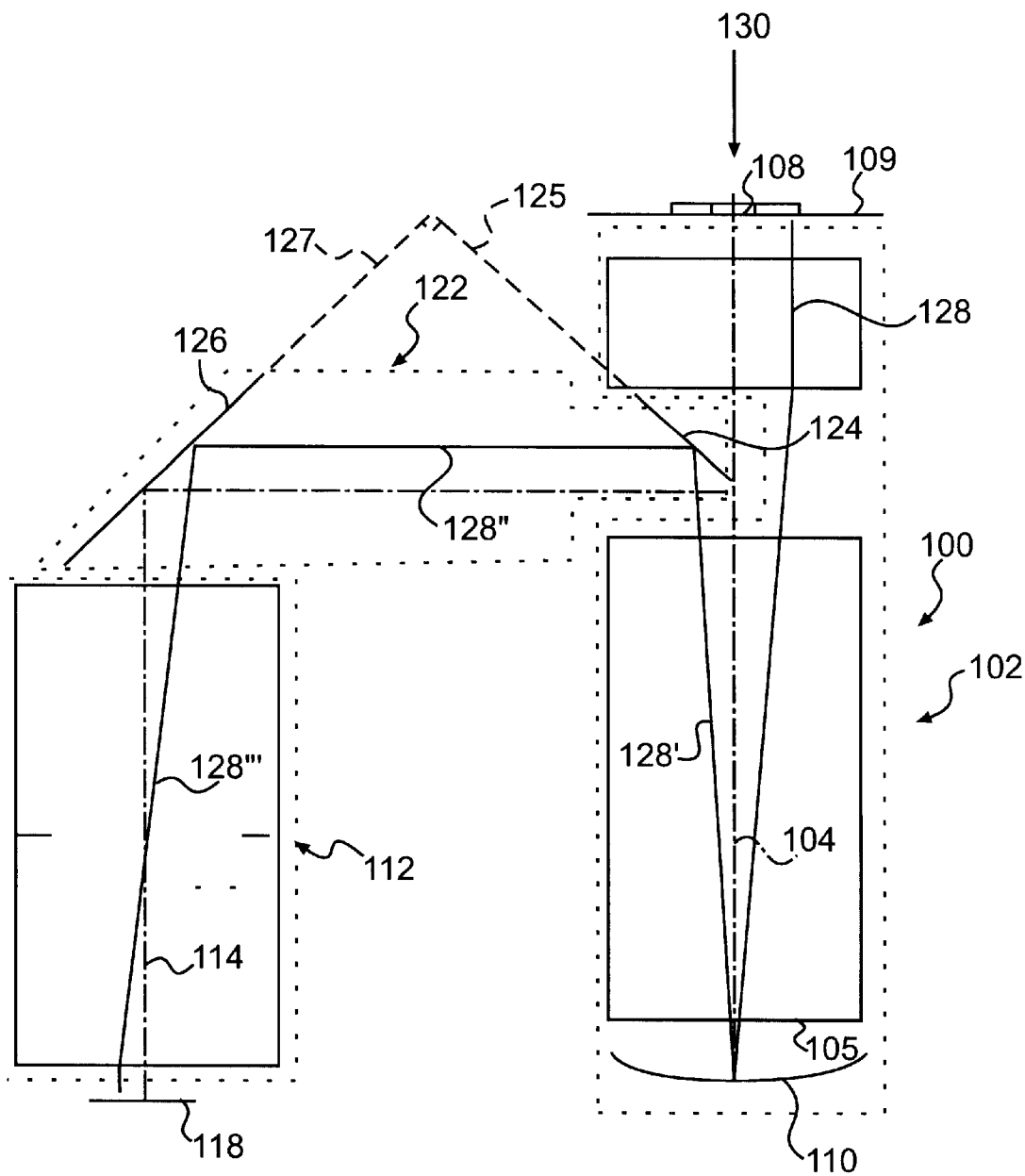
FIG. 3 is a schematic diagram of the catadioptric lens barrel structure, illustrated with light path passing through the lens barrel structure.

FIG. 3 schematically illustrates the path of exemplary light beam 128 passing through the catadioptric lens barrel structure 100 previously discussed with respect to FIGS. 1 and 2. Light source 130 illuminates a reticle 108 near an entrance end of first lens barrel 102. Reticle 108 is shown as placed on an image plane 109. Light source 130 enters first lens barrel 102. A reflective element 110, such as a mirror, is provided and positioned in front of an exit end 105 of first lens barrel 102 on an opposing end of reticle 108. Mirror 110 preferably has an optical axis which is aligned with first optical axis 104. Light beam 128 is reflected off of mirror 110, illustrated as light beam 128'. Light beam 128' travels back through first lens barrel 102. Light beam 128' then hits first mirror 124 carried inside connecting lens barrel 122, is reflected off of first mirror 124, as light beam 128", and is reflected off of second mirror 126, as light beam 128'''. Light beam 128''' travels through second lens barrel 112 and hits semiconductor wafer 118. First and second mirrors 124 and 126 are preferably oriented at 45° angle from light beams 128' and 128", respectively. Therefore, in this embodiment if imaginary extension lines 125 and 127 are drawn from mirrors 124 and 126, respectively, it shows that mirrors 124 and 126 are substantially perpendicular to each other.

Consistent with the principles of the invention, a kinematic alignment structure is provided, comprising two sets of at least three positioning knobs. Each set is distributed on each end face of the connecting lens barrel around a perimeter thereof. First and second mirrors are positioned in direct contact with the connecting lens barrel via the corresponding set of three positioning knobs.

According to one embodiment, as shown in FIGS. 4–7, a kinematic alignment structure 200 comprises three positioning knobs 212, 214, and 216 (best shown in FIG. 4) distributed on second end face 154 of connecting lens barrel 122 around perimeter 155 thereof. Second mirror 126 is positioned in direct contact with connecting lens barrel 122 via positioning knobs 212, 214, and 216.

FIGS. 5 and 7 illustrate positioning knob 214 seated on a platform 214a, having a raised tubular body 214b and a spherical top surface 214c. All positioning knobs 212, 214, and 216, have a similar configuration and are made of the same material. Positioning knobs 212, 214, and 216, are preferably made of the same material and formed as integral portions of connecting lens barrel 122 because the use of adhesive may cause difficulty in fabricating the alignment structure 200 and maintaining dimension stability. Connecting lens barrel 122 and positioning knobs 212, 214, and 216, may be made of a low expansion material, such as those listed in Table 1, to minimize alignment errors due to environmental changes. Alternatively, connecting lens barrel 122 and positioning knobs 212, 214, and 216, may be made of brass, brass alloy, or stainless steel. Brass and brass alloy are relatively inexpensive and easy to machine to achieve components with high tolerances, while stainless steel is generally stronger than brass and does not corrode. However, other constructions may be used that are consistent with the principles of the invention. Positioning knobs 212, 214, and 216, may also be formed separately for attachment to perimeters 153 and 155 of connecting lens barrel 122. Positioning knobs 212, 214, and 216 may be made of a material having a low coefficient of thermal expansion as those listed in Table 1, brass, brass alloy, or stainless steel.

At the opposite end of transverse lens barrel 122 is a structure similar to positioning knobs 212, 214, and 216. That is, mirror 124 is also aligned against transverse lens barrel 122 using three positioning knobs configured and made of materials similar to positioning knobs 121, 214, and 216.

Consistent with the principles of the invention, the kinematic alignment structure may further comprise two set of at least three reference pads. One set is positioned on the first mirror, and another set positioned on the second mirror. The two sets of reference pads on the first and second mirrors have matching configuration with the corresponding two sets of positioning knobs on the first and second end faces of the connecting lens barrel.

Figure 4:
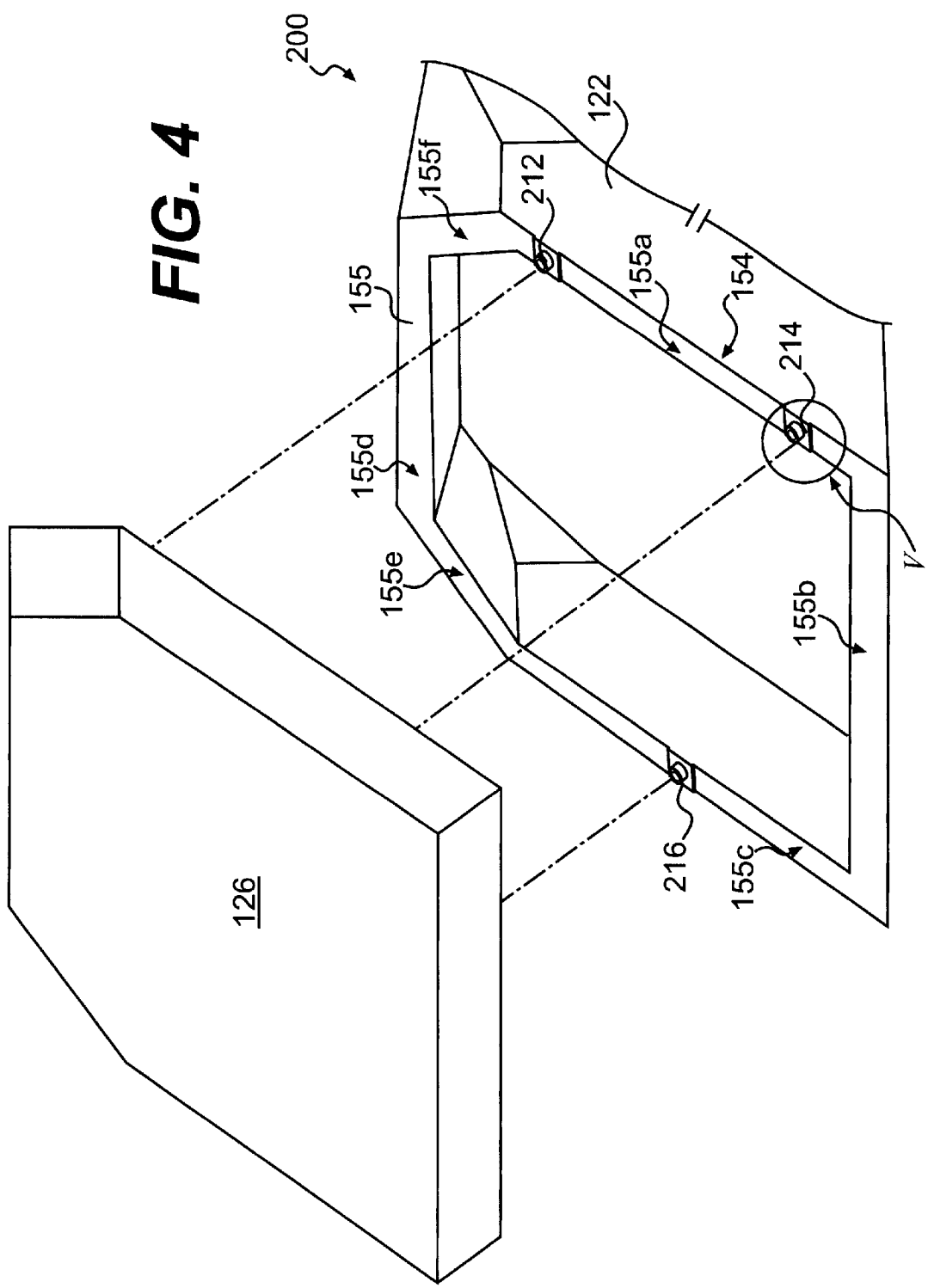
FIG. 4 is an exploded perspective view of a kinematic alignment structure consistent with the principles of the present invention, showing a portion of the connecting lens barrel and a second mirror.

According to a first embodiment, kinematic alignment structure 200 may also comprise two sets of at least three reference pads. FIGS. 4, 6 and 7 show mirror 126 and a portion of connecting lens barrel 122. A set of three reference pads 232, 234, and 236 are distributed on second mirror 126. Reference pads 232, 234, and 236, are preferably made of the same material and formed as integral portions of second mirror 126. Mirror 126 may be made of a material having a low coefficient of thermal expansion, such as those listed in Table 1, or other materials suitable for a reflective element. Alternatively, the first and second sets of reference pads 222, 224, 226, 232, 234, and 236, may be made separately as attachments to mirror 126.

Reference pads 232, 234, and 236, have the same configuration as the configuration of positioning knobs 212, 214, and 216. FIG. 7 shows positioning knobs 214 on second end face 154 matching with reference pad 234 on second mirror 126.

Similar to the positioning knobs, at the opposite end of transverse lens barrel 122 is a structure similar to reference pads 232, 234, and 236. That is, three reference pads are distributed on mirror 124. The reference pads distributed on mirror 124 function in a similar manner to reference pads 232, 234, and 236, and may be configured and made of materials similar to reference pads 232, 234, and 236. The positioning knobs at each end of transverse lens barrel 122 may have many different orientations. The orientation may be similar to each other or entirely different at each end.

In one embodiment, as shown in FIG. 4, connecting lens barrel 122 has a rectangular cross-section with edges 155a, 155b, 155c, and 155d, and chamfer cuts 155e and 155f on two corners. Positioning knobs 212, 214, and 216 on second end face 154 are shown to be distributed with two positioning knobs 212 and 214 on edge 155a and one positioning knob 216 on opposing edge 155c. Other configurations (not shown) include distributing positioning knobs 212, 214, and 216, on any three of four edges 155a, 155b, 155c, and 155d, of the connecting lens barrel 122. Alternatively, connecting lens barrel 122 may have a circular cross-section (not shown). In that case, the positioning knobs may be uniformly distributed at a substantially 120° around the perimeter of the circular cross-section, or may also be randomly distributed. The positioning knobs at each end of transverse lens barrel 122 may follow the same configuration, or may have a different configuration all together as compared to the other end. Of all these various combinations, one rule applies: the reference pads must follow the configuration of the corresponding positioning knobs.

According to another embodiment, kinematic alignment structure 200 may also comprise a pair of lens cells (not shown). A first lens cell supports first mirror 124, while a second lens cell supports second mirror 126. The first lens cell is positioned in direct contact with the first end face via respective positioning knobs. The second lens cell is positioned in direct contact with the second end face 154 via positioning knobs 212, 214, and 216. The first and second lens cells may have two sets of reference pads (not shown) similar to reference pads 232, 234, and 236. The two sets of reference pads on the first and second lens cells have the same configuration and are made of the same material as reference pads 232, 234, and 236.

Consistent with the principles of the invention, direct contact is used to minimize the number of components required to align mirrors 124 and 126 and to assemble connecting lens barrel 122, thus promoting stability and repeatability. According to the first embodiment, the alignment process begins with positioning first and second mirrors 124 and 126 onto first and second end faces 152 and 154, respectively, of connecting lens barrel 122. Alternatively, according to the second embodiment, mirrors 124 and 126 are supported by the first and second lens cells, the lens cells are positioned onto the end faces and in direct contact with the lens cells. Despite the addition of parts to the lens barrel structure, the second embodiment has the advantage of the first and second lens cells providing additional support to the first and second mirrors, respectively.

Figure 8:
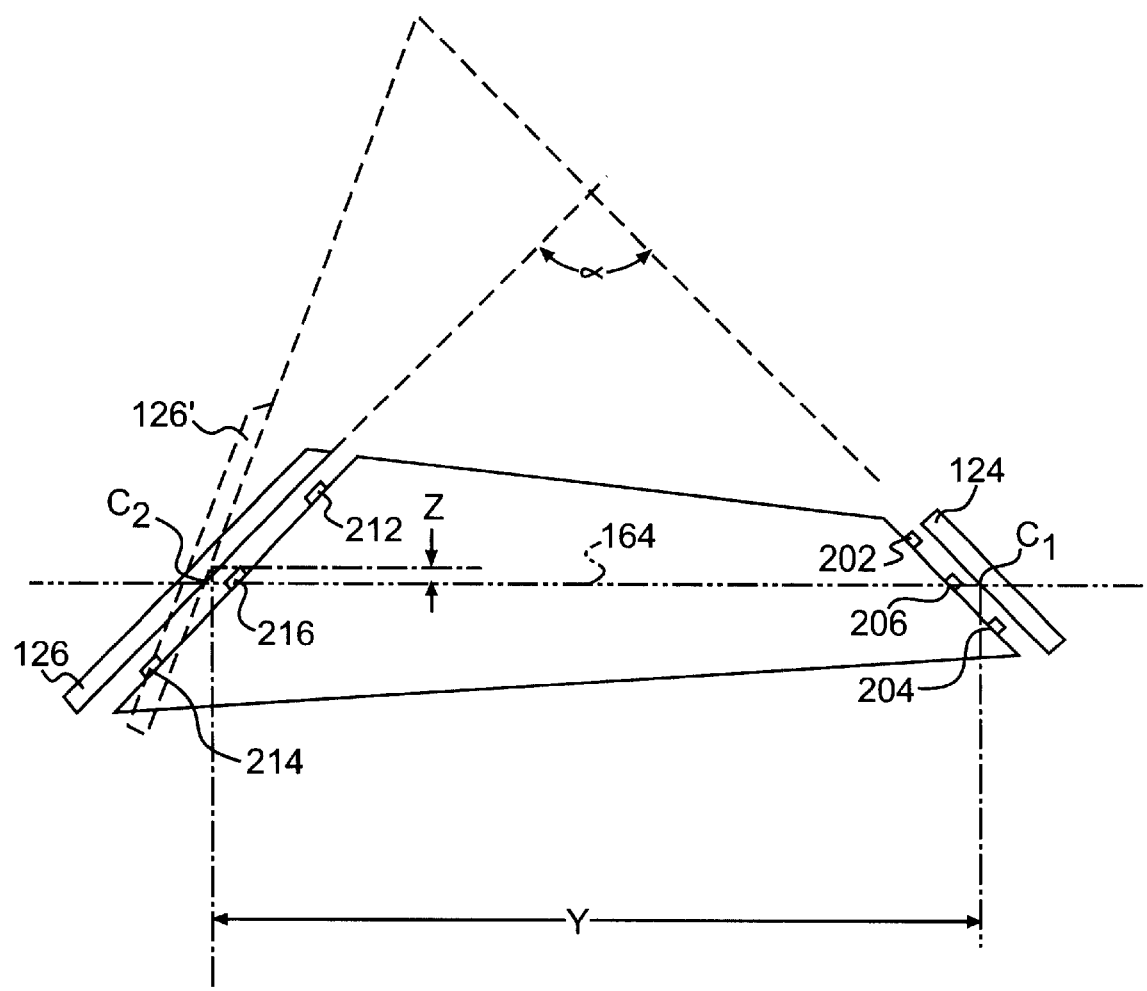
FIG. 8 is a partial front view of the connecting lens barrel and both mirrors, illustrating a misalignment of the second mirror with respect to the first stationary mirror.

FIG. 8 illustrates the alignment process, which involves first measuring the angle α created by first and second mirrors 124 and 126, respectively, as well as measuring distance Y along y-axis and distance Z along z-axis between center points C1 and C2. Both embodiments operate in a similar fashion. Therefore, the following discussion only refers to the first embodiment, but applies to both. In both embodiments, the target parameters of the present invention are that the angle α is preferably 90° ±1 second, distance Y is preferably 520 mm ±2 microns, and distance Z is preferably 0±2 microns. After taking preliminary measurements of the three parameters above, mirrors 124 and 126 may need some alignment to fine-tune their positions to obtain the targeted parameters. To fine tune their positions, mirrors 124 and 126 are removed, and microscopic adjustment is accomplished by polishing certain portions or all of the protruding heights of the appropriate spherical top surfaces. For example, with respect to positioning knob 214, spherical top 214c would be polished. To simplify the process, adjustment may be done only on one of mirrors 124 and 126, while the other mirror is fastened to connecting lens barrel 122. Mirror 124 or 126 may be secured to connecting lens barrel 122 by fastening means, such as a plurality of clamps, screws, bolts, strap-bindings, or other suitable means. For example, first mirror 124 is stationary, and second mirror 126 is in a misaligned position, shown as mirror 126' in exaggeration in FIG. 8. Second mirror 126 will need to be lowered along the z-direction until second center point C2 is aligned with first center point C1 along optical axis 164 within the targeted tolerance of ±2 microns. Next, if distance Y is smaller the targeted parameter, then all spherical top surfaces of the positioning knobs need to be polished to reduce the protruding heights at substantially the same amount until distance Y is within the allowed tolerance of 520 mm ±2 microns. Finally, if the angle α is smaller than the targeted parameter, then spherical top surfaces of positioning knobs 212, and 216 if necessary, need to be polished to microscopically adjust angular orientation of second mirror 126' until the angle α is within the allowed tolerance of 90° ±1 second. The process of measuring and polishing may be repeated as many times as necessary to achieve the targeted parameters. Second mirror 126 may then be repositioned and fastened to connecting lens barrel 122.

It will be apparent to those skilled in the art that various modifications and variations can be made in construction of the positioning knobs and the reference pads, the optical lens barrel, including its components, as well as the material chosen for the present invention, and other aspects of the invention without departing from the scope or spirit of the invention. For example, the positioning knobs could be located on the planar element, such as the mirror, and the reference pads could be located on the lens barrel. Furthermore, although the embodiments shown use planar elements, the principles described herein could also be applied to aligning non-planar surfaces.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims and their equivalents.

I claim:

1. A kinematic alignment structure for positioning a first surface and a second surface in a lens barrel, the alignment structure comprising:
    a set of at least three positioning knobs distributed at predetermined locations around a perimeter of the first surface,
    wherein the first surface is an end face of a lens barrel and the second surface is a planar element positioned in direct contact with the lens barrel via the at least three positioning knobs, and
    wherein the at least three positioning knobs and the first surface are made of a material having a coefficient of thermal expansion of 6 ppm/°C or below.

2. The kinematic alignment structure of claim 1, wherein the at least three positioning knobs are made of a material which can be polished to adjust the position of the second surface.

3. The kinematic alignment structure of claim 1, further comprising:
    means for fastening the second surface to the lens barrel after the planar element is adjusted to a desired position.

4. The kinematic alignment structure of claim 3, wherein the fastening means includes at least one of a plurality of clamps, screws, bolts, and strap-bindings.

5. The kinematic alignment structure of claim 1, further comprising:
    a set of at least three reference pads positioned on the second surface at locations corresponding to the at least three positioning knobs.

6. A kinematic alignment structure for positioning a first surface and a second surface in a lens barrel, the alignment structure comprising:
    a set of at least three positioning knobs distributed at predetermined locations around a perimeter of the first surface,
    wherein the first surface is a planar element and the second surface is an end face of a lens barrel, the first surface being positioned in direct contact with the lens barrel via the at least three positioning knobs, and
    wherein the at least three positioning knobs and the second surface are made of a material having a coefficient of thermal expansion of 6 ppm/°C or below.

7. The alignment structure of claim 6, wherein the at least three positioning knobs are made of the same material and formed as integral portions of the planar element.

8. A lens barrel structure, comprising:
    a plurality of lens barrels aligned in a parallel orientation;
    at least one transverse lens barrel for connecting the plurality of lens barrels;
    a support structure for supporting the plurality of lens barrels and the at least one transverse lens barrel; and a kinematic alignment structure for positioning a first surface and a second surface of the transverse lens barrel.

9. The lens barrel structure of claim 8, wherein the kinematic alignment structure comprises:

a set of at least three positioning knobs distributed at predetermined locations around a perimeter of the first surface in the transverse lens barrel.

10. The lens barrel structure of claim 10, further comprising:

a set of at least three reference pads positioned on the second surface at locations corresponding to the at least three positioning knobs.

11. The lens barrel structure of claim 9, wherein the first surface is an end face of the transverse lens barrel, and the second surface is a planar element positioned in direct contact with the transverse lens barrel via the at least three positioning knobs.

12. The lens barrel structure of claim 11, further comprising:

means for fastening the second surface to the transverse lens barrel.

13. The lens barrel structure of claim 11, further comprising:

a cell for supporting the second surface, wherein the cell is positioned in direct contact with the transverse lens barrel via the at least three positioning knobs.

14. The lens barrel structure of claim 9, wherein the first surface is a planar element and the second surface is an end face of the transverse lens barrel, the first surface being positioned in direct contact with the transverse lens barrel via the at least three positioning knobs.

15. The lens barrel structure of claim 14, further comprising:

means for fastening the first surface to the transverse lens barrel.

16. The lens barrel structure of claim 14, further comprising:

a cell for supporting the first surface, wherein the cell is positioned in direct contact with the transverse lens barrel via the at least three positioning knobs.

* * * * *

UNITED STATES PATENT AND TRADEMARK OFFICE
CERTIFICATE OF CORRECTION

PATENT NO.    : 6,577,457 B1
DATED         : June 10, 2003
INVENTOR(S)   : Marc Spinali It is certified that error appears in the above-identified patent and that said Letters Patent is hereby corrected as shown below:

Column 9,
Line 9, "claim 10," should read -- claim 9, --.

Signed and Sealed this

Twenty-fifth Day of November, 2003

JAMES E. ROGAN
*Director of the United States Patent and Trademark Office*